(12) United States Patent
Mattausch

(10) Patent No.: US 6,516,392 B1
(45) Date of Patent: Feb. 4, 2003

(54) ADDRESS AND DATA TRANSFER CIRCUIT

(75) Inventor: Hans Jürgen Mattausch, Higashi-Hiroshima (JP)

(73) Assignee: Hiroshima University, Higashi-Hiroshima (JP)

( * ) Notice: Subject to any disclaimer, the term of this patent is extended or adjusted under 35 U.S.C. 154(b) by 0 days.

(21) Appl. No.: 09/533,336

(22) Filed: Mar. 23, 2000

(30) Foreign Application Priority Data

Mar. 25, 1999 (JP) .......................................... 11-081288

(51) Int. Cl.$^7$ .......................... G06F 12/00; G06F 12/16
(52) U.S. Cl. ....................................... 711/149; 711/211
(58) Field of Search ............................. 711/5, 131, 149, 711/211, 147, 150

(56) References Cited

U.S. PATENT DOCUMENTS 5,542,067 A    7/1996  Chappell et al.
5,619,674 A *  4/1997  Ikumi .......................... 395/458
6,212,607 B1 * 4/2001  Miller ........................... 711/149

OTHER PUBLICATIONS

Koji et al., *A Development Of Multi–port Memory With Small Area Based On A New Hierarchical Architecture*, The Institute of Electronics, Information and Communication Engineers, Mar. 25 to 28, 1999.

* cited by examiner

Primary Examiner—Hiep T. Nguyen
Assistant Examiner—Ngoc Dinh
(74) Attorney, Agent, or Firm—Alston & Bird LLP

(57) ABSTRACT

An address and data transfer circuit includes enable circuit for enabling a single-port memory in accordance with an access requirement from a corresponding port out of a plurality of external ports. An active address selecting circuit selects an address from the corresponding port and transfers the address to the single port memory responsive to activation of the enabling circuit. An active data selecting circuit selects a data from the corresponding port and transfers the data to or from the single port memory, responsive to activation of the enabling circuit.

5 Claims, 7 Drawing Sheets

ADDRESS AND DATA TRANSFER CIRCUIT

BACKGROUND OF THE INVENTION

1. Field of the Invention

The present invention relates to an address and data transfer circuit required for a hierarchical multi-port memory comprising a plurality of single-port memories.

2. Description of the Related Art

In order to implement a single-chip system having advanced processing functions such as audio and/or video processing or language translation, it is essential to obtain a high data-processing bit rate. Therefore, it will be required in future that the achievable data-processing bandwidth is as high as decades or hundreds times of that possible at the present time. To fulfill such requirement, a multi-port memory having an access bandwidth on the order of tera bits ($10^{12}$ bits) per second should be used instead of a single-port memory estimated to have a practical limit of about 50 Gbit/s. The access bandwidth of the tera bits per second order can be realized in the multi-port memory having 32 ports whose word length is 64 bit for each port under a practical clock frequency of 500 MHz, for example.

When constructing a conventional multi-port memory, a large circuit area is required and it is thus difficult to utilize the multi-port memory as a practical mass storage device. In view of such difficulty, a hierarchical multi-port memory has been proposed as described, for example, in H. J. Mattausch: "Hierarchical N-Port Memory Architecture based on 1-Port Memory Cells", Proc. 23rd European Solid-State Circuits Conf., Southampton, UK, September, pp. 348–351, 1997. Such a multi-port memory is comprised of single-port memories, and thus requires only a small circuit area.

However, as the hierarchical multi-port memory should have a data input/output function and a function for selectively connecting the external ports to the single-port memories, it is required to have an address and data transfer circuits, which are not necessary for any other conventional multi-port memory.

DISCLOSURE OF THE INVENTION

It is therefore an object of the present invention to provide an address and data transfer circuit required for a hierarchical multi-port memory with a very small occupied area and capable of achieving an access bandwidth on the tera bits per second order.

According to the present invention, there is provided an address and data transfer circuit comprising: enable circuit means for enabling a single-port memory in accordance with an access requirement from a corresponding port out of a plurality of external ports; active address selecting circuit means, responsive to activation of the enabling circuit means, for selecting an address from the corresponding port and transferring the address to the single port memory; and active data selecting circuit means, responsive to activation of the enabling circuit means, for selecting a data from the corresponding port and transferring the data to or from the single port memory.

With the above-mentioned arrangement according to the invention, the hierarchical multi-port memory with a very small occupied area and an access bandwidth of the tera bits per second order can be realized.

Preferably, the enable circuit means comprises: enabling circuits to which selection signals are input from the corresponding port, and from which an address selection signal is output to the active address selecting circuit means, respectively; operating circuits to which a read/write signal from the corresponding port and the address selection signal are input, and from which a read signal and a write signal based on the read/write signal and also on the address selection signal are output to the active data selecting circuit means, respectively; a first OR gate to which a plurality of the address selection signals are input, and from which a logical sum of the address selection signals is output to the active address selecting circuit means and the single-port memory; and a second OR gate to which a plurality of the write signals are input, and from which a logical sum of the write signals is output to the single-port memory.

Preferably, active address selecting means comprises a multiplexer for multiplexing the address signals and inputting the multiplexed address signals to the single-port memory.

Preferably, active data circuit means comprises: a multiplexer for multiplexing the data and outputting the multiplexed data to the single-port memory; and a demultipexer for demultiplexing the data from the single-port memory and outputting the demultiplexed data to the corresponding port.

DESCRIPTION OF THE PREFERRED EMBODIMENT

One embodiment of the address and data transfer circuit according to the present invention will be explained below with reference to the accompanying drawings.

Figure 1:
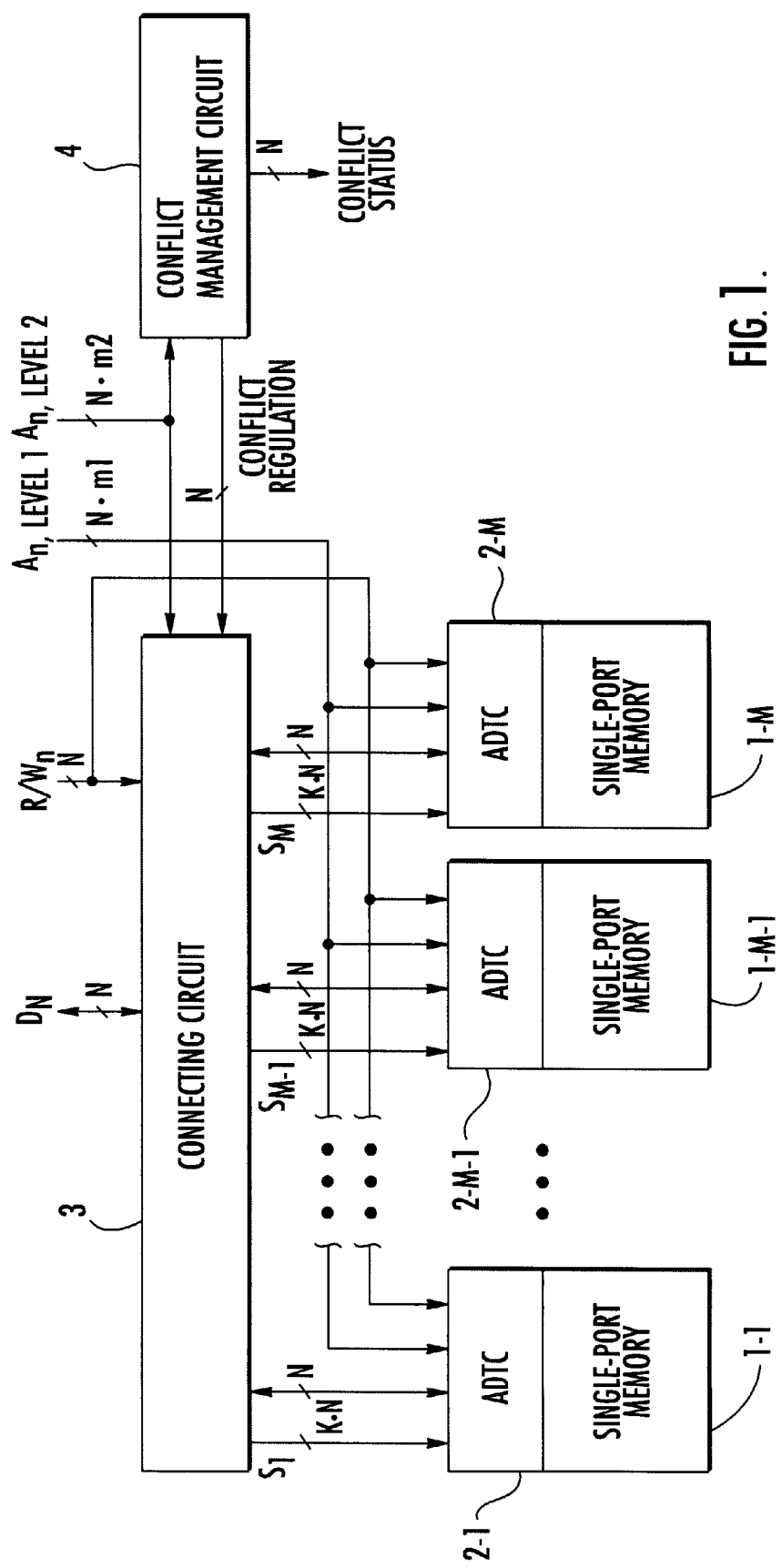
FIG. 1 is a schematic diagram showing a multi-port memory comprising the address and data transfer circuit according to the present invention.

FIG. 1 is a schematic diagram showing the multi-port memory comprising the address and data transfer circuit according to the present invention. In FIG. 1, the hierarchical multi-port memory is only shown in a 2-level hierarchy, and it has ports of the number N, typically not less than 2. The memory comprises single-port memories 1-1, . . . , 1-M−1, 1-M, typically M being not less than 2, arranged in a line; address and data transfer circuits 2-1, . . . , 2-M−1, 2-M, each corresponding to one of the single-port memories 1-1, . . . ,1-M−1, 1-M; a connecting circuit 3 connecting each single-port memory to a corresponding port of an address decoder (not shown) in the 2-level hierarchy; and a conflict management circuit 4 so as to allow access of only one port to one single-port memory every instance. In this case, the word length is 1 bit.

Each single port memory 1-1, . . . , 1-M−1, or 1-M has a conventional construction, and has a data input terminal, a data output terminal, an address decoder and so on. These components are not shown.

Each address and data transfer circuit (ADTC) 2-1, . . . , 2-M−1, or 2-M is input each external selection signal $S_1$, . . . , $S_{M-1}$, or $S_M$ for the corresponding single-port memory from the connecting circuit 3. Each external selection signal $S_1$, . . . , $S_{M-1}$, or $S_M$ has k bits, k being typically not less than 1. Each address and data transfer circuit 2-1, . . . , 2-M−1, or 2-M is also input 1st-level hierarchy address signals $A_{n,level1}$ of the number N, and external read/write signals $R/W_n$ of the number N ($N \geq n \geq 1$). Each 1st-level hierarchy address signals $A_{n,level1}$ has $m_1$ bits, $m_1$ being typically not less than 1. Each address and data transfer circuit 2-1, . . . , 2-M−1, or 2-M is input data signals $D_n$ of the number N through the connecting circuit 3, and outputs the data signals $D_n$ through the connecting circuit 3.

The connecting circuit 3 is input 2nd-level hierarchy input address signals $A_{n,level2}$ of the number N each having $m_2$ bits, $m_2$ being not less than 1, and the external read/write signals $R/W_n$ of the number N from external. The connecting circuit 3 is input conflict regulation signals of the number N from the conflict management circuit 4. The conflict management circuit 4 is input the 2nd-level hierarchy input address signals $A_{n,level2}$, and outputs conflict status signals of the number N to external. The conflict management circuit 4 guarantees that not more than one port accesses to a single-port memory in an access cycle.

Detailed construction and operation of the multi-port memory and the connecting circuit 3 shown in FIG. 1 are disclosed in above-mentioned document, for example. Detailed construction and operation of the conflict management circuit 4 are disclosed, for example, in K. Yamada, H. Lee, T. Murakami, and H. J. Mattausch: "An Area-Efficient Circuit Concept for Dynamical Conflict Management of N-port Memories with Multi-GBits/s Access Bandwidth", Proc. 24$^{th}$ European Solid-State Circuits Conf., The Hague, Netherlands, 22–24 September, pp. 140–143, 1998. Therefore, the construction and the operation of these circuits are not described in detail hereinafter.

Figure 2:
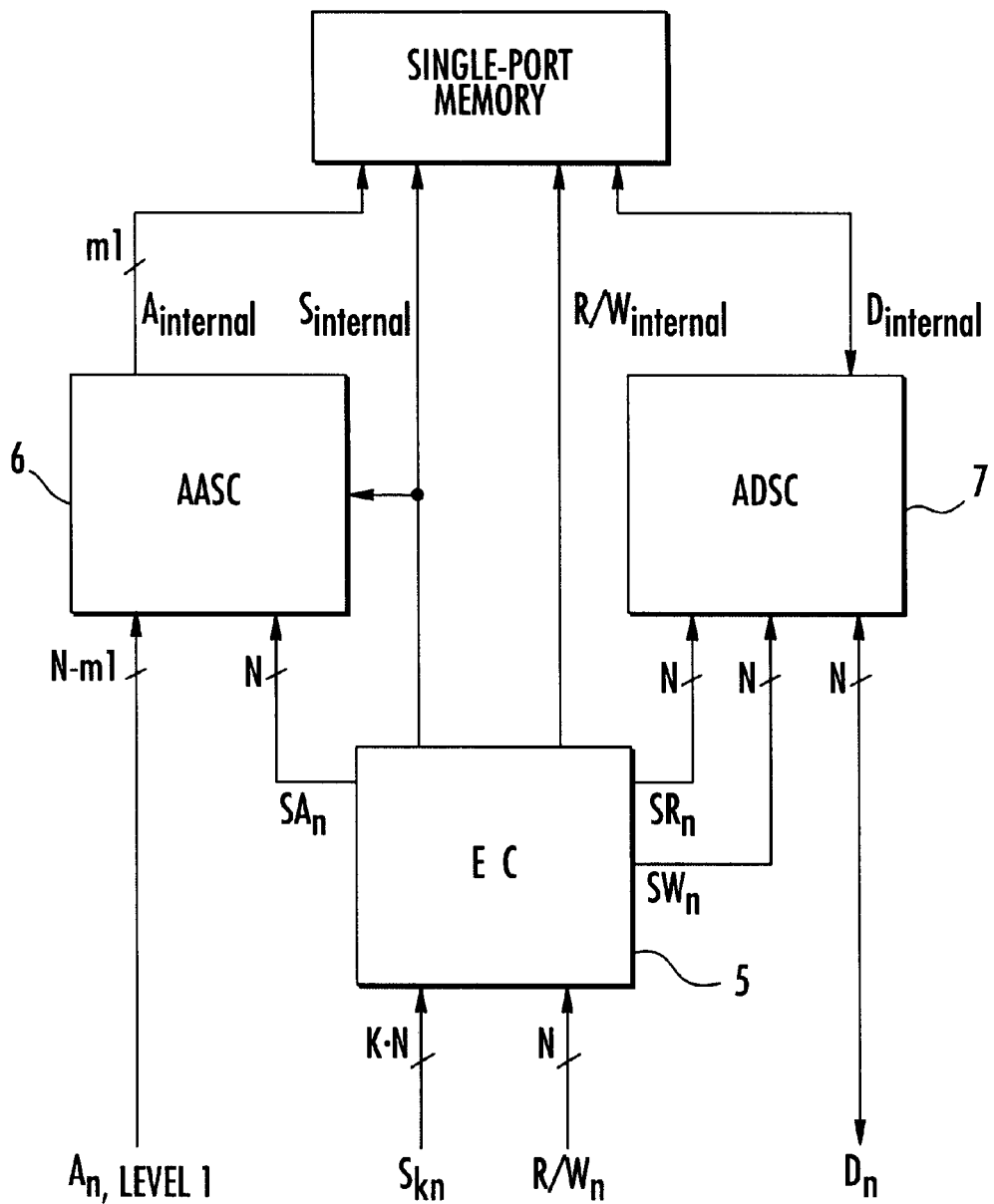
FIG. 2 is a schematic diagram showing an embodiment of the address and data transfer circuit according to the present invention.

FIG. 2 is a schematic diagram showing an embodiment of the address and data transfer circuit according to the present invention. It only shows the address and data transfer circuit of a 1st-level hierarchy of the hierarchical multi-port memory. The address and data transfer circuit shown in FIG. 2 corresponds to any one of the address and data transfer circuits 2-1, . . . , 2-M−1, 2-M shown in FIG. 1. The address and data transfer circuit comprises an enable circuit 5 which enables the corresponding single-port memory (not shown), an active-address selecting circuit (AASC) 6 which selects an address from the port (port n) requiring an access, and an active-data selecting circuit (ADSC) 7 which selects a data from the port requiring the access.

The enable circuit 5 also enables the active-address selecting circuit 6 and the active-data selecting circuit 7 in accordance with the access requirement from any one of external ports of the number N, and makes the corresponding single-port memory (not shown) operable. Concretely, the enable circuit 5 is input external selection signals $S_{kn}$, each having k bits, of the number N from each port corresponding to any one of the external selection signal $S_1$, . . . , $S_{M-1}$, or $S_M$ shown in FIG. 1, and is input the external read/write signals $R/W_n$, each having 1 bit, of the number N from each port. The enable circuit 5 outputs address selection signals $SA_n$ of the number N to the active-address selection circuit 6, outputs read selection signals $SR_n$ of the number N and write selection signals $SW_n$ of the number N to the active-data selecting circuit 7, outputs a single-port memory enabling signal $S_{internal}$ which drives e.g. an address decoder (not shown) in the single-port memory and the active-address selecting circuit 6, and outputs a read/write signal $R/W_{internal}$ for performing read/write operation in the corresponding single-port memory to an input terminal (not shown) of the single-port memory. A detailed construction of the enable circuit 5 will be described below.

The number k of bits of the external selection signal $S_{kn}$ depends on the arrangement of the single-port memories. When the single-port memories are arranged in a line, k usually equals to 1. When the single-port memories are arranged in a matrix form, k equals to 2, and when the single-port memories have a three dimensional arrangement, k equals to 3.

The active-address selecting circuit 6 is input the 1st-level hierarchy input address signals $A_{n,level1}$, each having $m_1$ bits, of the number N in addition to the address selecting signal $SA_n$ and the single-port memory enabling signal $S_{internal}$. The active-address selecting circuit 6 outputs an address signal $A_{internal}$, having $m_1$ bits, to the address decoder of the single-port memory. The active-address selecting circuit 6 selects an address signal $A_{n,level1}$, having $m_1$ bit, of the 1st-level hierarchy supplied from the port n, and outputs it to the address decoder of the single-port memory as an address signal $A_{internal}$. As a result, the active-address selecting circuit 6 preferably consists of a N input-1 output multiplexer. A detailed construction of the active-address selecting circuit 6 will be described below.

The active-data selecting circuit 7 inputs a data signal $D_{internal}$ to an input terminal (not shown) of the single-port memory, and is input the data signal $D_{internal}$ from an output terminal (not shown) of the single-port memory. The active-data selecting circuit 7 is also input data signals $D_n$ of the number N from external through the connecting circuit 3 (FIG. 1) in addition to the read selection signals $SR_n$ and write selection signals $SW_n$ of the number N, respectively, and outputs the data signals $D_n$ to external through the connecting circuit 3. The active-data selecting circuit 7 has a function connecting a data line of the port which has the access requirement to an internal data line of the single port memory. It is required that the active-data selecting circuit 7 is capable of transmitting the data signal from external to the single-port or from the single-port memory to external. As a result, the active-data selecting circuit 7 preferably consists of a bidirectional N input-1 output/1 input-N output multiplexer/demultiplexer. A detailed construction of the active-data selecting circuit 7 will be described below.

In the embodiment, each of the external ports of the number N has a data whose bit width is 1, however, in general, i.e. if the bit width is w, typically not less than 2, bit widths of data signals $D_{internal}$ and $D_n$ equal to w, respectively.

Figure 3:
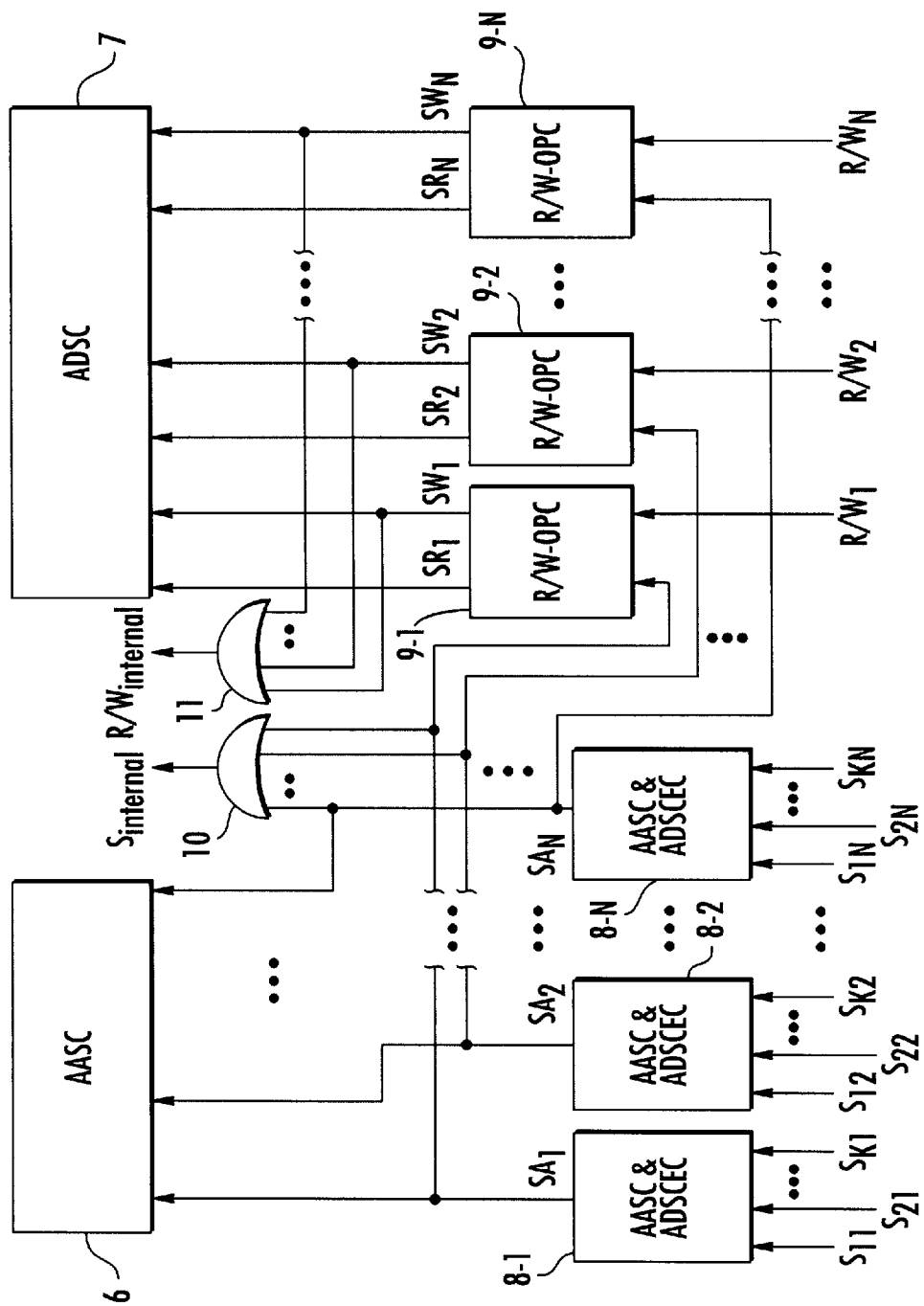
FIG. 3 is a circuit diagram of the enable circuit shown in FIG. 2.

FIG. 3 is a circuit diagram of the enable circuit shown in FIG. 2. The enable circuit comprises active-address selecting circuit and active-data selecting circuit enabling circuits (AASC&ADSCEC) 8-1, 8-2, . . . , 8-N of the number N, read/write operating circuits (R/W-OPC) 9-1, 9-2, . . . , 9-N of the number N, and N input OR gates 10 and 11.

Figure 4:
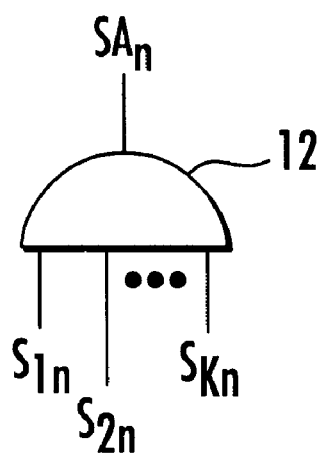
FIG. 4 is a circuit diagram of the active-address selecting circuit and the active-data selecting circuit enabling circuit (AASC&ADSCEC) shown in FIG. 3.

The active-address selecting circuit and active-data selecting circuit enabling circuits 8-1, 8-2, . . . , 8-N are input external selection signals $S_{11}, S_{21}, \ldots, S_{k1}; S_{12}, S_{22}, \ldots S_{k2}; \ldots; S_{1N}, S_{2N}, \ldots, S_{kN}$, respectively. The active-address selecting circuit and active-data selecting circuit enabling circuits 8-1, 8-2, ..., 8-N output address selection signals $SA_1, SA_2, \ldots, SA_N$ to the active-address selection circuit 6 (FIG. 2), respectively. Each active-address selecting circuit and active-data selecting circuit enabling circuit 8-1, 8-2, ..., or 8-N consists of a k input AND gate 12 (FIG. 4), for example.

The read/write operating circuits 9-1, 9-2, ..., 9-N are input the corresponding one of the address selection signals $SA_1, SA_2, \ldots, SA_N$ and the corresponding one of the external read/write signals $R/W_1, R/W_2, \ldots, R/W_N$. The read/write operating circuits 9-1, 9-2, ..., 9-N output the corresponding one of the read selection signals $SR_1, SR_2, \ldots, SR_N$ or the corresponding one of the write selection signals $SW_1, SW_2, \ldots, SW_N$.

Figure 5:
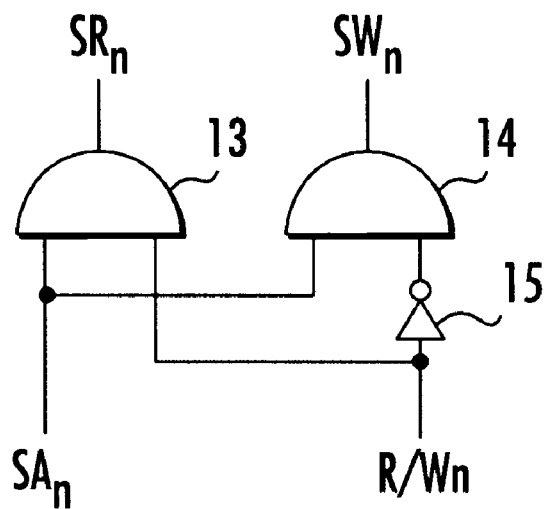
FIG. 5 is a circuit diagram of the read/write operating circuit (R/W-OPC) shown in FIG. 3.

Each read/write operating circuit 9-1, 9-2, ..., or 9-N consists of two 2 input AND gates 13 and 14, and an inverter 15 (FIG. 5). In this case, if the corresponding port (port n) is not selected ($SA_n=0$), both of the read selection signal $SR_n$ and the write selection signal $SW_n$ equal to 0. If the corresponding port is selected ($SA_n=1$), it is determined whether the reading operation or the writing operation is performed. That is, it is determined whether the read selection signal $SR_n$ or the write selection signal $SW_n$ equals to 1.

The N input OR gate 10 outputs the single-port memory enabling signal $S_{internal}$ as a logical sum of the address selection signals $SA_1, SA_2, \ldots, SA_N$, each being input to the corresponding input terminal of the N input OR gate 10. The N input OR gate 11 outputs the read/write signal $R/W_{internal}$ as a logical sum of the write selection signals $SW_1, SW_2, \ldots, SW_N$, each being input to the corresponding input terminal of the N input OR gate 11.

Figure 6:
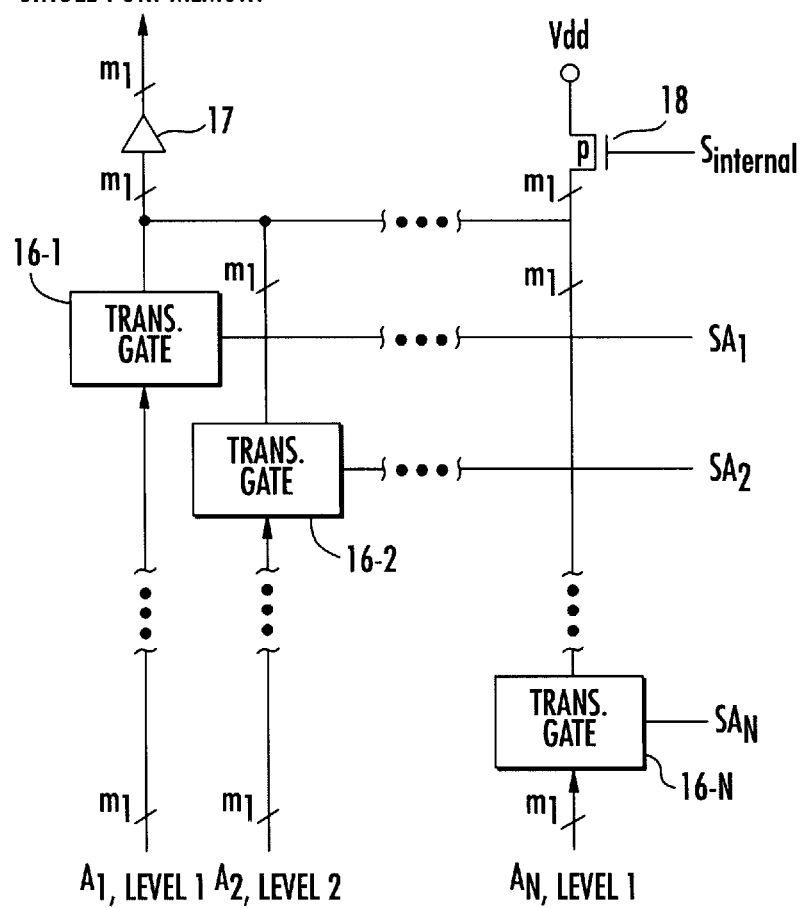
FIG. 6 is a circuit diagram of the active-address selecting circuit shown in FIG. 2.

FIG. 6 is a circuit diagram of the active-address selecting circuit shown in FIG. 2. The active-address selecting circuit is implemented by a multiplexing circuit which comprises transmission gates (Trans.gate) 16-1, 16-2, ..., 16-N of the number N, each corresponding to each external port 1, 2, ..., or N of address buffers 17 through which is input any one of outputs of the transmission gates, and switches 18 which include p type transistors of the number N.

The transmission gates 16-1, 16-2, ..., 16-N are controlled by the address selection signals $SA_1, SA_2, \ldots, SA_N$, respectively. In this way, only address bits of the accessing port are transferred to an internal node, and connected to the address decoder.

Figure 7:
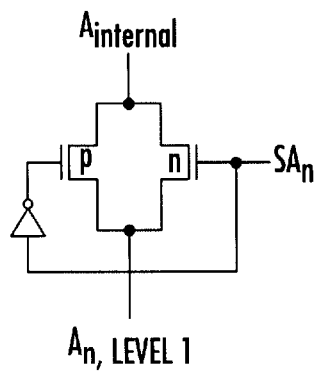
FIG. 7 is a circuit diagram of the transmission gate shown in FIG. 6.

If no port accesses to the single-port memory, the value of the single-port memory enabling signal $S_{internal}$ becomes 0, and the otherwise floating nodes after the transmission gates are pre-charged to a defined voltage value with the switches 18. In FIG. 6, a pre-charge voltage is set to a supply voltage $V_{dd}$. Of course, it is possible to set the pre-charge voltage to any other voltage. FIG. 7 is a circuit diagram showing a transmission gate shown in FIG. 6. In FIG. 7, p and n represent the conductivity type of transistors, respectively.

Figure 8:
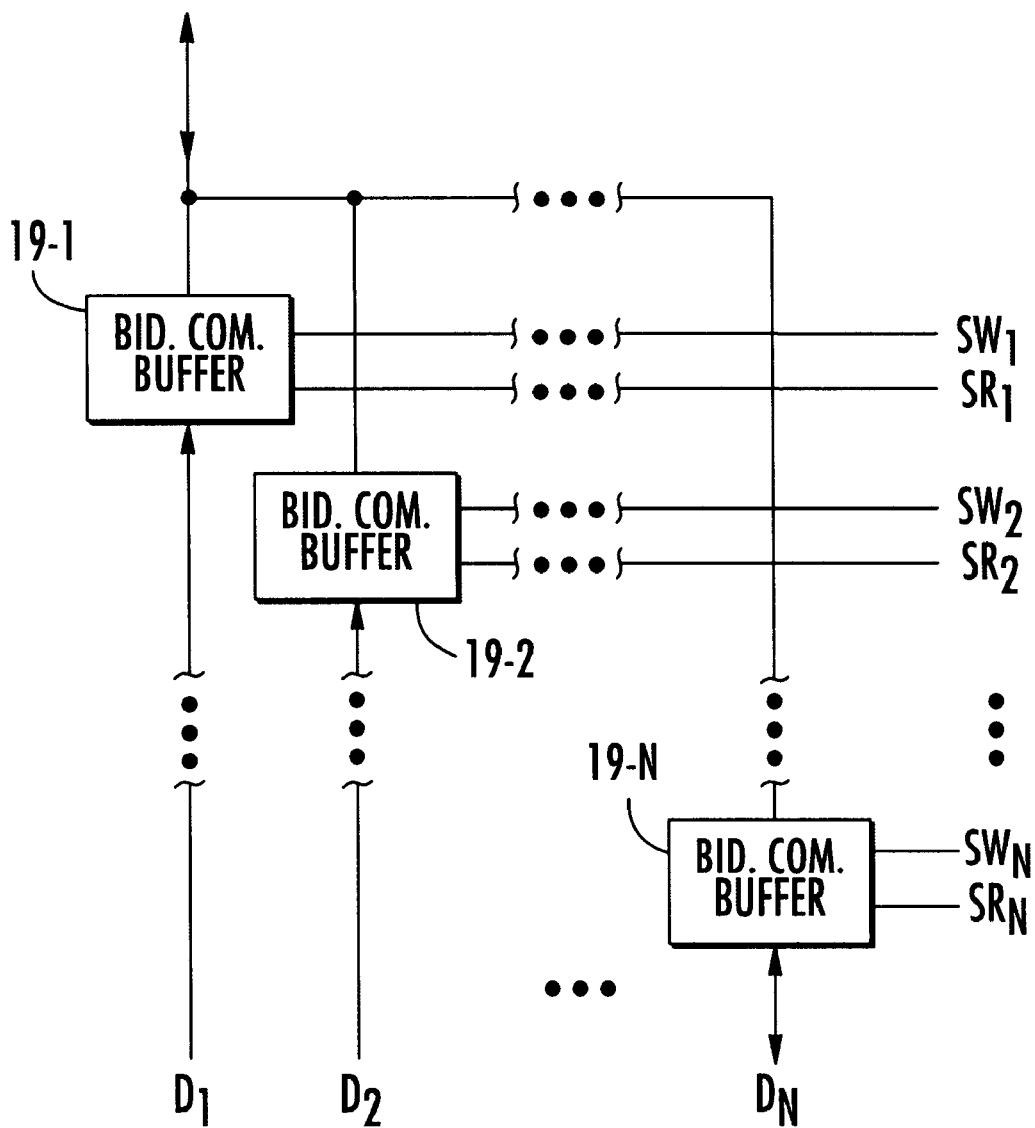
FIG. 8 is a circuit diagram of the active-data selecting circuit shown in FIG. 2.

FIG. 8 is a circuit diagram of the active-data selecting circuit shown in FIG. 2. The active-data selecting circuit has bidirectional transmission buffers (Bid.Com.Buffer) 19-1, 19-2, ..., 19-N, each corresponding to each external port 1, 2, ..., or N, respectively. Each bidirectional buffer 19-1, 19-2, ..., or 19-N connects the corresponding external port to the input or output terminal of the single-port memory.

Figure 9:
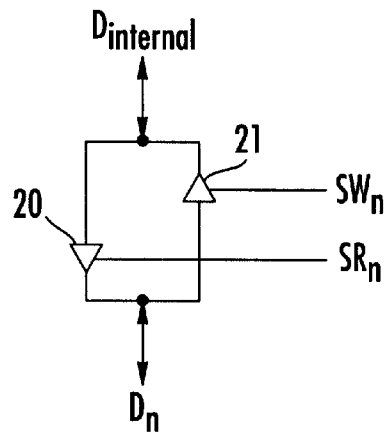
FIG. 9 is a circuit diagram of the bidirectional communication buffer shown in FIG. 8.
Figure 10:
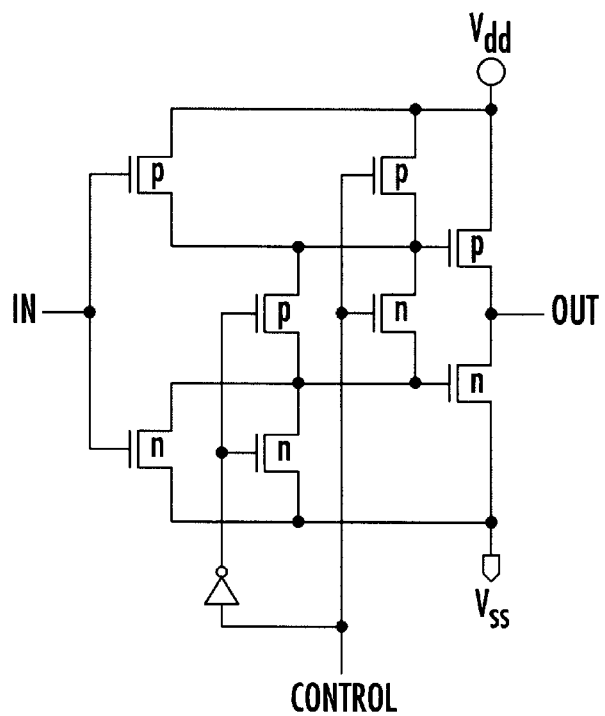
FIG. 10 is a circuit diagram of the tristate buffer.

FIG. 9 is a circuit diagram of the bidirectional communication buffer shown in FIG. 8. A tristate buffer 20 shown in FIG. 9 is activated with the read selection signal $SR_n$ when reading the data. A tristate buffer 21 shown in FIG. 9 is activated with the write selection signal $SW_n$ when writing the data. FIG. 10 is a circuit diagram of a tristate buffer. In FIG. 10, n and P represent the conductive type of transistors, respectively, and IN, OUT, $V_{dd}$, $V_{ss}$, and Control represent an input terminal, an output terminal, a supply voltage, a reference voltage, and read or write selection signal $SR_n$ or $SW_n$, respectively.

The operation of the embodiment will be described hereinafter. When the port n requires the access to the corresponding single-port memory, the external selection signals $S_{kn}$ and the read/write signals $R/W_n$ are supplied to the enable circuit 5, the 1st-level hierarchy input address signals $A_{n,level1}$ are supplied to the active-address selection circuit 6, and the data $D_n$ are supplied to the active-data selection circuit 7.

The conflict management circuit 4 connects the access of at most one port to a single-port memory every access cycle. In such a manner, the external selection signals $S_{kn}$ enable the single-port memory for at most one port n.

If all corresponding external selection signals $S_{kn}$ have value 1, the port n can access to the corresponding single-port memory. In this case, the enable circuit 5 generates the address selection signal $SA_n$ and the single-port memory enabling signal $S_{internal}$, each having the value 1.

If the read/write signal $R/W_n$ has the value 0, the enable circuit 5 generates the write signal $SW_n$, and the value of the read signal $SR_n$ remains 0. If the value of the write signal $SW_n$ becomes 1, the value of the read/write signal $R/W_{internal}$ becomes 1, and the single-port memory switches to the writing mode. On the other hand, the value of the read/write signal $R/W_{internal}$ becomes 0, and the single-port memory maintains the reading mode. Any other read signals, write signals and address signals hold the value 0 because any other ports are not selected.

When the enable circuit 5 generates the address selection signal $SA_n$ with the value 1, the address bits of the port n are connected to the decoder of the single-port memory, and the single-port memory enabling signal $S_{internal}$ with the value 1 enables the single-port memory decoder. Thereby, an access path for a specific single-port memory is activated, and it is determined whether the reading operation or the writing operation is performed in accordance with the read/write signal $R/W_{internal}$.

If the reading operation is performed, or $SR_n=1$ and $SW_n=0$, the data $D_{internal}$ read from the single-port memory is multiplexed by the active-data selecting circuit 7, and the data $D_n$ multiplexed in such a manner is output to the port n.

If the writing operation is performed, or $SR_n=0$ and $SW_n=1$, the tristate buffer 21 is activated, and the tristate buffer 21 transmits the data $D_n$ from the port n to the input terminal of the single-port memory. In this way, the data $D_n$ from the port n is written into the single-port memory correctly.

If the corresponding single-port memory is not selected, the address selection signal $SA_n$, the read selection signal $SR_n$ and the write selection signal $SW_n$ hold the value 0, respectively. As a result, the address and data transfer circuit disconnects all addresses and all data from the corresponding single-port memory. The operation of the decoder of the single-port memory is stopped when the value of the single-port memory enabling signal $S_{internal}$ becomes 0.

Such an address and data transfer circuit is essential for the hierarchical multi-port memory with a very small occupied area and the access bandwidth on the tera bits per second order. A conventional multi-port memory has an occupied area which is proportional to the square of the number of the ports, so that the hierarchical multi-port memory has a remarkable small occupied area (silicon area) compared with that of the conventional memory if there are a large number of ports in the multi-port memory. For example, if the hierarchical multi-port memory with the address and data transfer circuit according to the present invention has 32 ports, the hierarchical multi-port memory will have only a small fraction of the occupied area of the conventional multi-port memory with 32 ports. Concretely, if the single-port memory cell is a small-sized cell such as a ROM cell or a DRAM cell, only one-fiftieth (1/50) of the occupied area of the conventional multi-port memory is required for the hierarchical multi-port memory, and even if the single-port memory cell is a large-sized cell such as an SRAM cell, not more than one-twentieth (1/20) of the occupied area of the conventional multi-port memory is required for the hierarchical multi-port memory.

While the present invention has been described above with reference to a certain preferred embodiment, it should be noted that it was presented by way of an example only and various changes and/or modifications may be made without departing from the scope of the invention. For example, the enable circuit, the active-address selecting circuit and the active-data selecting circuit may have any other construction than that described hereinbefore. The n type transistor and the p type transistor may be used instead of the p type transistor and the n type transistor, respectively. The values 1 and 0 of the signal may be used instead of the value 0 and 1, respectively.

I claim:

1. An address and data transfer circuit for connecting an individual single-port memory to an N number of ports of a multi-port memory device having a plurality of single-port memories, said circuit comprising:

enable circuit means connected to a selected single-port memory of the multi-port memory device for enabling said single-port memory in accordance with an access requirement from a corresponding port out of a plurality of external ports;

active address selecting circuit means, responsive to activation of said enabling circuit means, for selecting an address from said corresponding port and transferring the address to said single port memory; and active data detect circuit means, responsive to activation of said enabling circuit means, for selecting a data from said corresponding port and transferring the data to or from said single port memory, wherein said address and data transfer circuit connects said selected single-port memory to the N number of ports independent of the other single-port memories of the multi-port memory device.

2. The address and data transfer circuit according to claim 1, wherein said enable circuit means comprises:

enabling circuits to which selection signals are input from said corresponding port, and from which an address selection signal is output to said active address selecting circuit means, respectively;

operating circuits to which a read/write signal from said corresponding port and said address selection signal are input, and from which a read signal and a write signal based on said read/write signal and also on said address selection signal are output to said active data selecting circuit means, respectively;

a first OR gate to which a plurality of said address selection signals are input, and from which a logical sum of said address selection signals is output to said active address selecting circuit means and said single-port memory; and a second OR gate to which a plurality of said write signals are input, and from which a logical sum of said write signals is output to said single-port memory.

3. The address and data transfer circuit according to claim 1, wherein said active address selecting means comprises a multiplexer for multiplexing said address signals and inputting the multiplexed address signals to said single-port memory.

4. The address and data transfer circuit according to claim 1, wherein said active data selecting circuit means comprises:

a multiplexer for multiplexing said data and outputting the multiplexed data to said single-pot memory; and a demultiplexer for demultiplexing said data from said single-port memory and outputting the demultiplexed data to said corresponding port.

5. A multi-port memory device comprising;

an N number of ports;

a plurality of single-port memories for individual connection to the N number of ports; and individual address and data transfer circuits associated with each of the single-port memories, wherein a respective address and data transfer circuit connects a respective single-port memory of the multi-port memory device to the N number of ports independent of the other single-port memories, and wherein each address and data transfer circuit comprises:

enable circuit means connected to a respective single-memory for enabling the respective single-port memory in accordance with an access requirement from a corresponding port out of a plurality of external ports;

active address selecting circuit means, responsive to activation of said enabling circuit means, for selecting an address from said corresponding port and transferring the address to the respective single port memory; and active data detecting circuit means, responsive to activation of said enabling circuit means, for selecting a data from said corresponding port and transferring the data to or from the respective single port memory.

* * * * *

UNITED STATES PATENT AND TRADEMARK OFFICE
CERTIFICATE OF CORRECTION

PATENT NO. : 6,516,392 B1
DATED : February 4, 2003
INVENTOR(S) : Mattausch

It is certified that error appears in the above-identified patent and that said Letters Patent is hereby corrected as shown below:

Title page,
Item [56], References Cited, U.S. PATENT DOCUMENTS,
"Miller" should read -- Miller et al. --.

Column 7,
Line 48, "detect" should read -- detecting --.

Column 8,
Line 27, "single-pot" should read -- single-port --.

Signed and Sealed this

Eighth Day of July, 2003

JAMES E. ROGAN
*Director of the United States Patent and Trademark Office*